United States Patent
Flynn

[11] Patent Number: 6,034,545
[45] Date of Patent: Mar. 7, 2000

[54] MACROCELL FOR DATA PROCESSING CIRCUIT

[75] Inventor: David Walter Flynn, Cambridge, United Kingdom

[73] Assignee: ARM Limited, Cambridge, United Kingdom

[21] Appl. No.: 09/015,927

[22] Filed: Jan. 30, 1998

[51] Int. Cl.[7] .............................................. H03K 19/177
[52] U.S. Cl. ................................. 326/39; 326/56; 326/82
[58] Field of Search ........................... 326/37–41, 56, 326/82, 83, 86

[56] References Cited

U.S. PATENT DOCUMENTS

| | | | |
|---|---|---|---|
| 5,585,742 | 12/1996 | Kamiya | 326/56 |
| 5,686,844 | 11/1997 | Hull et al. | 326/46 |
| 5,705,938 | 1/1998 | Kean | 326/41 |
| 5,850,151 | 12/1998 | Cliff et al. | 326/39 |
| 5,880,595 | 3/1999 | Whetsel | 326/40 |
| 5,894,565 | 4/1999 | Furtek et al. | 326/38 |

*Primary Examiner*—Jon Santamauro
*Assistant Examiner*—Don Phu Le
*Attorney, Agent, or Firm*—Nixon & Vanderhye P.C.

[57] ABSTRACT

The present invention provides a macrocell for a data processing circuit, comprising macrocell logic, and an interface for connecting the macrocell logic to a bus of the data processing circuit. The interface comprises: an input bus connected to an input bus terminal, an output bus connected to an output bus terminal, and a buffering circuit for buffering the output bus from the macrocell logic. Further, the interface has a mode input terminal for receiving a mode value, the mode value being arranged to control the buffering circuit. The buffering circuit is responsive to a first mode value to enter an inactive state when no data is being output from the macrocell, and is responsive to a second mode value to permanently drive the output bus. Hence, to enable the macrocell to be coupled to a unidirectional bus on the data processing circuit, the second mode value is supplied to the mode input terminal, whilst to enable the macrocell to be coupled to a bidirectional bus on the data processing circuit, the input bus terminal and output bus terminal are connected together externally to the macrocell, and the first mode value is supplied to the mode input terminal.

11 Claims, 4 Drawing Sheets

MACROCELL FOR DATA PROCESSING CIRCUIT

BACKGROUND OF THE INVENTION

1. Field of the Invention

The present invention relates to macrocells for data processing circuits. For the purpose of the present application, the term "macrocell" refers to any physically or logically modular component for a data processing circuit, for example a raw processor core, a cache, a memory management unit (MMU), or even a processor with cache and MMU, etc.

2. Description of the Prior Art

Typically, a data processing circuit such as a chip will include a number of macrocells that are arranged to interact with each other to perform data processing operations. Modular components such as the central processing unit, or processor core, used to apply instructions to data items read from memory, one or more caches or memories used to store instructions and data, a DMA bus master used to control activities such as data transfer, and an external memory interface for holding data to be output from the chip to memory, are examples of components which may be formed as macrocells.

During operation of the data processing circuit, the various macrocells will often interact with one another, for example by passing data, address information, or control information from one macrocell to another. To enable this transfer of information between the various macrocells, one or more buses are typically provided on the data processing circuit to connect the macrocells to one another. Since there is the potential for different macrocells to simultaneously seek to output data on to a particular bus, then bus arbitration logic is typically provided to control the various macrocells' access to the buses with the aim of removing any such conflict between the various macrocells.

In designing buses for data processing circuits, various different types of bus technology have been developed. Generally, these different types of bus fall into two categories, the first category being the bidirectional, or shared-driver, bus where the same bus is used to output data from a macrocell and also to receive data at that macrocell, whilst the second category is the unidirectional bus where one bus is provided for data being output from a particular macrocell, and a second, distinct bus is provided for data being input to that macrocell.

In data processing circuits that employ unidirectional buses, the various macrocells are typically arranged to always output a logic "0" or a logic "1" value, with multiplexer circuitry being provided to switch the output from any particular macrocell onto the output bus. However, in data processing circuits employing a bidirectional bus design, the outputs from each macrocell are typically not always driven, and when not outputting data, the macrocells are arranged to have a high impedance at their output, thereby removing the need for separate multiplexer circuitry to be provided.

Given the above two general categories of buses, it is clear that when designing a macrocell for a data processing circuit, it is important to know which type of bus the macrocell is intended to be connected to, since this will affect the design of the macrocell interface to the bus. However, this adds to design cost, and limits the reusability of macrocells.

Hence, it is an object of the present invention to provide a macrocell which can be used with either unidirectional or bidirectional buses.

SUMMARY OF THE INVENTION

Viewed from a first aspect, the present invention provides a macrocell for a data processing circuit, comprising: macrocell logic; and an interface for connecting the macrocell logic to a bus of the data processing circuit; the interface comprising: an input bus connected to an input bus terminal and an output bus connected to an output bus terminal; a buffering circuit for buffering the output bus from the macrocell logic; a mode input terminal for receiving a mode value, the mode value being arranged to control the buffering circuit; the buffering circuit being responsive to a first mode value to enter an inactive state when no data is being output from the macrocell, and being responsive to a second mode value to permanently drive the output bus; whereby to enable the macrocell to be coupled to a unidirectional bus on the data processing circuit, the second mode value is supplied to the mode input terminal, whilst to enable the macrocell to be coupled to a bidirectional bus on the data processing circuit, the input bus terminal and output bus terminal are connected together externally to the macrocell, and the first mode value is supplied to the mode input terminal.

In accordance with the present invention, the macrocell is provided with a generic interface having separate input bus terminals and output bus terminals. Within the macrocell, input data received at the input bus terminal is passed over an input bus to the macrocell logic, whilst data output from the macrocell logic is passed over an output bus to the output bus terminal. A buffering circuit is provided to buffer the output bus from the macrocell logic. Further, in accordance with the present invention, a mode input terminal is provided on the macrocell for receiving a mode value that is used to control the buffering circuit. In response to a first mode value, the buffering circuit is arranged to enter a high impedance state when no data is being output from the macrocell. Hence, to enable the macrocell to the coupled to a bidirectional bus on the data processing circuit, the input bus terminal and the output bus terminal are connected together externally to the macrocell, and the first mode value is supplied to the mode input terminal.

However, in response to a second mode value, the buffering circuit is arranged to permanently drive the output bus. Hence, to enable the macrocell to be coupled to a unidirectional bus on the data processing circuit, all that is required is to provide the second mode value to the mode input terminal and for such a use, the input bus terminal and output bus terminal are not connected together.

By this approach, it is possible for the macrocell to be developed without regard to the particular type of bus to which the macrocell will ultimately be connected. If the macrocell is to be provided to a party that wishes to use the macrocell within a data processing circuit employing a unidirectional bus architecture, then that party need only arrange for the second mode value to be supplied to the mode input terminal on the macrocell, and the macrocell will then interface correctly with the unidirectional bus. Alternatively, if the macrocell is to be used on a data processing circuit employing a bidirectional bus architecture, then the party is instructed to connect the input bus terminal to the output bus terminal, and to ensure that the first mode value is provided to the mode input terminal of the macrocell.

Typically a bus will be a multi-bit bus, for example a 32-bit bus. An "n-bit" bus will have "n" separate bus lines, such that one bus line is provided for each bit. In such instances, it will be appreciated that within the macrocell of the present invention, an input bus, an input bus terminal, an output bus and an output bus terminal will be provided for each bus line of each bus. However, in preferred embodiments, only one mode input terminal will be provided for the whole macrocell, since the whole macrocell will typically be configured with all drivers unidirectional or bidirectional.

The buffering circuit may take any appropriate form. However, in preferred embodiments, the buffering circuit comprises a tristate buffer, a tristate buffer being arranged to have a high impedance when not driven, and to output either a logic 0 or a logic 1 value when driven.

In preferred embodiments, the tristate buffer is turned on in response to receipt of the second mode value by the macrocell, or in response to an output enable signal generated by the macrocell.

In preferred embodiments, the output enable signal is activated whenever the macrocell is permitted to drive output signals onto the bus according to the particular bus protocol. For example, the address and control outputs are normally only permitted to drive output signals onto the address and control buses, respectively, when the macrocell is 'Granted' on the bus by a bus arbitration unit. Similarly, the data outputs are only normally permitted to drive output signals onto the data bus when the macrocell is performing a write transfer and is granted the bus.

In certain embodiments, the output enable signal is required externally to the macrocell, for example as an input to multiplexers used in a unidirectional bus configuration. Accordingly, in preferred embodiments, the interface comprises an output enable terminal for outputting the output enable signal and a buffer for buffering the output enable signal prior to it being passed to the output enable terminal. The presence of the buffer ensures that, independent of the load attached to the output enable terminal, the timing of the output enable signal will not be affected, and hence the operation of the macrocell is independent of the external configuration.

In preferred embodiments, the inactive state entered by the buffering circuit in response to the first mode value is a high impedance state.

Any suitable logic may be provided to drive the tristate buffer in response to either the second mode value or the output enable signal. However, in preferred embodiments the interface further comprises a logical OR gate which is arranged to receive at its inputs the mode value and the output enable signal, the output of the logical OR gate being used to control the tristate buffer.

Preferably, the second mode value is a logic '1' level signal which, when the macrocell is arranged to be coupled to a unidirectional bus on the data processing circuit, causes the tristate buffer to be turned on so as to permanently drive the output bus. Further, in preferred embodiments, the first mode value is a logic '0' level signal which, when the macrocell is arranged to be coupled to a bidirectional bus on the data processing circuit, causes the tristate buffer to be turned on only when the output enable signal is at a logic '1' level, thereby causing the tristate buffer to enter a high impedance state when no data is being output from the macrocell.

As mentioned earlier, the macrocell may be any physically or logically modular component of a data processing circuit, for example a processor core.

In preferred embodiments, when the macrocell is arranged to be coupled to a unidirectional bus, the tristate buffer is turned on so as to permanently drive the output bus. In such an embodiment, general fluctuations in the output signal from the macrocell logic may cause the tristate buffer to drive the output on the output bus from the logic 0 state to the logic 1 state, and vice versa, even when the macrocell is not generating an output for passing over the data processing circuit's unidirectional bus. This is not desirable, since any change of the output bus values will drive any connected circuitry, thereby dissipating power. To alleviate this problem, in preferred embodiments, the buffering circuit further comprises a latch located between the output of the macrocell logic and the tristate buffer, the latch being arranged to be driven by the output enable signal. This ensures that the input of the tristate buffer is isolated from any fluctuations of the output from the macrocell logic until such time as the macrocell actually intends to generate an output signal on the unidirectional bus. At that time, the output enable signal is arranged to drive the latch so as to cause the output signal from the macrocell logic to be passed to the tristate buffer. By this approach, significant power savings can be achieved, since the output bus values will only change in valid output periods.

Viewed from a second aspect, the present invention provides a data processing circuit, comprising: a plurality of macrocells; a bus connecting the macrocells; at least one of the macrocells being a macrocell in accordance with the first aspect of the present invention.

BRIEF DESCRIPTION OF THE DRAWINGS

The present invention will be described further, by way of example only, with reference to a preferred embodiment thereof as illustrated in the accompanying drawings, in which.

DESCRIPTION OF A PREFERRED EMBODIMENT

Figure 1:
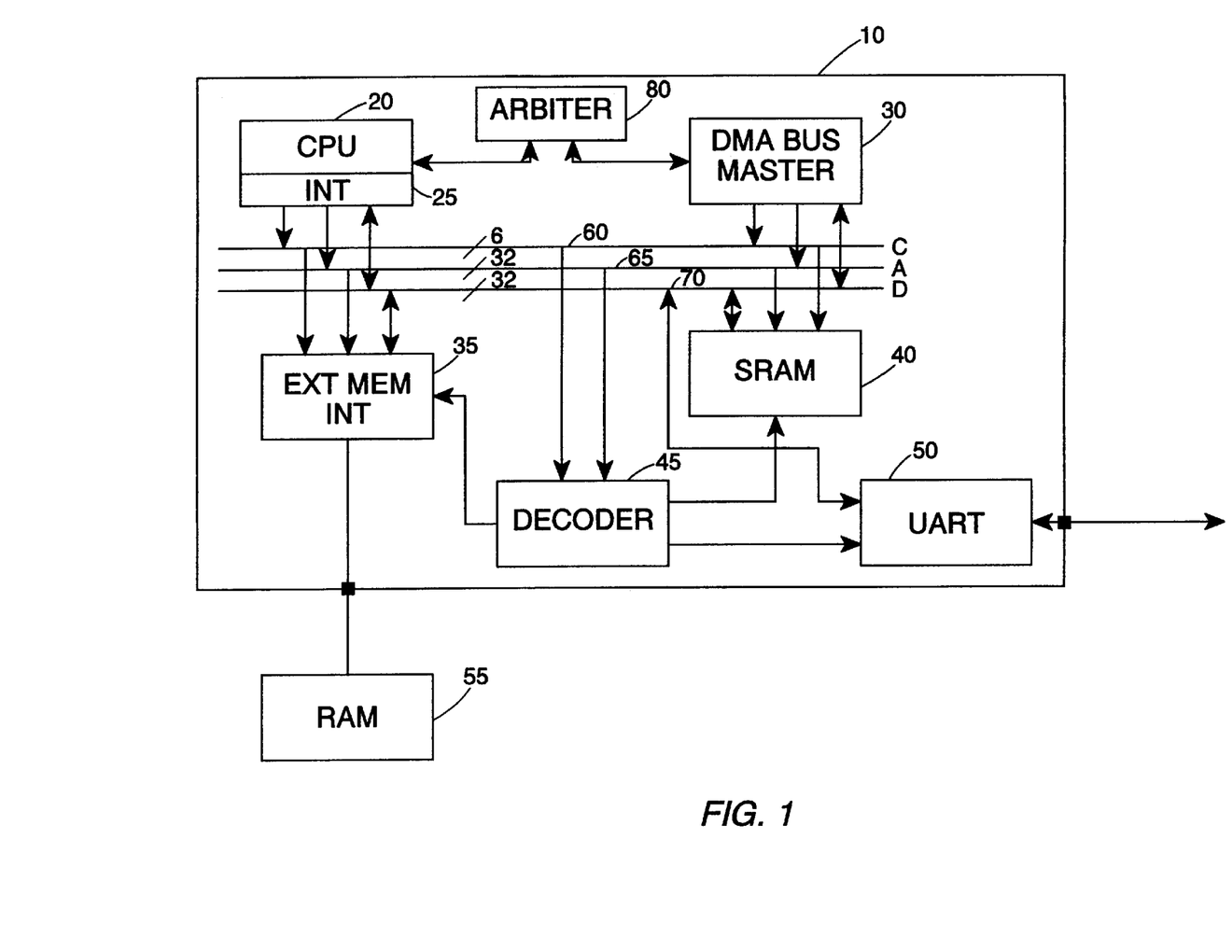
FIG. 1 is a block diagram of a data processing circuit, illustrating a number of macrocells provided on that data processing circuit, along with their connections to buses provided on the data processing circuit.

FIG. 1 is a block diagram of a data processing circuit, in this case a chip 10. which illustrates a number of macrocells that may be provided on the chip 10. along with their various connections to a number of buses provided on the chip 10.

Within the chip 10 illustrated in FIG. 1, a CPU 20 and a Direct Memory Access (DMA) bus master 30 are provided, which are able to output signals onto control 60 and address 65 buses, and also to output data onto, and receive data from, a data bus 70. Both the CPU 20 and DMA bus master 30 are referred to as "Bus Masters", since these macrocells are used to control the transfer of data over the buses.

To avoid contention between the Bus Masters, arbiter logic 80 is provided, which is arranged to select the Bus Master that is to be active on the bus at any particular time. In the present example, the arbiter 80 hence decides which of the CPU 20 or DMA bus master 30 is allowed, at any particular moment in time, to drive the address and control buses 60 and 65.

Also illustrated in FIG. 1 are three "Bus Slaves", namely an external memory interface 35, an SRAM 40, and a "Universal Asynchronous Receive and Transmit" (UART) peripheral 50. The Bus Slaves respond to instructions to transfer data issued by the Bus Masters, and in preferred embodiments a decoder 45 is provided to ensure that only one Bus Slave 35, 40, 50 is active at any one time. The decoder 45 is arranged to have access to the information output by either the CPU 20 or the DMA bus master 30 on the control 60 and address 65 buses. This information is used to determine which bus slave 35, 40, 50 should have access to the data bus. the decoder 45 then sending an appropriate control signal directly to the appropriate Bus Slave.

Hence, as an example, if the CPU 20 wishes to output data to an external memory such as RAM 55, then firstly the CPU 20 sends a request to the arbiter 80 for control of the buses. Once the arbiter 80 has granted the CPU 20 control of the buses, then the CPU 20 can output the appropriate control, address and data information onto the control 60, address 65 and data 70 buses, respectively. The information output onto the control and address buses 60 and 65 is then read by the decoder 45, and decoded by the decoder to determine that the external memory interface 35 should be active. The external memory interface 35 is notified accordingly by the decoder 45, and is then arranged to output the necessary control, address and data information to the RAM 55 via an external memory bus.

As another example, if data received by the UART 50 is to be loaded into the SRAM 40, then typically such an activity may be managed by the DMA bus master 30. Accordingly, the DMA bus master 30 will send a request to the arbiter 80 for control of the buses. Upon receipt of a grant signal from the arbiter 80, the DMA bus master 30 will perform a read at the address of the UART 50 receive data register by outputting the address and control information onto buses 65 and 60, respectively. The decoder 45 will respond by sending an appropriate signal to the UART 50 to select the relevant UART register, and the UART 50 will then output the data to the DMA bus master 30 over the data bus 70. The DMA bus master 30 will then perform a write to a particular address in the SRAM 40 by outputting the necessary control and address information onto the control 60 and address 65 buses, respectively, the decoder 45 determining from the information on the control 60 and address 65 buses that the SRAM 40 should be selected, and hence issuing an appropriate signal to the SRAM 40. The DMA bus master 30 then outputs the data onto the data bus 70, and the SRAM 40 stores that data at the selected SRAM address.

In the FIG. 1 example, the data bus 70 and address bus 65 are shown as 32-bit wide buses, whilst the control bus 60 is shown as a 6-bit wide bus. Clearly, the widths of the buses can be changed as required without affecting the general operation discussed earlier. Further, it should be noted that FIG. 1 shows the logical connections of the various macrocells to the buses, rather than the exact physical connections. For example, in a unidirectional bus implementation, there would actually be a number of multiplexers or OR gates to merge all of the drivers down to the logical buses illustrated in FIG. 1. Hence, for example, the output data from both the CPU 20 and the DMA bus master 30 would in such an implementation have to be multiplexed to the write data port on the Bus Slaves, and the Read data from each Bus Slave must be multiplexed to the input ports on the Bus Masters.

In accordance with preferred embodiments of the present invention, each of the macrocells 20, 30, 35, 40 and 50 are provided with a macrocell interface that enables the macrocell to be used with either unidirectional or bidirectional buses without any internal changes to the macrocell being required. For the sake of illustration, one of these macrocell interfaces, namely the macrocell interface 25 of the CPU macrocell 20, is illustrated in FIG. 1. Having described how macrocells may be arranged within a chip with reference to FIG. 1, the logic provided within the interface 25 of the CPU 20 in accordance with preferred embodiments of the present invention will now be described in more detail with reference to FIG. 2. As mentioned above, in preferred embodiments, the same logic will also be provided in each of the other macrocells 30, 35, 40 and 50.

Figure 2:
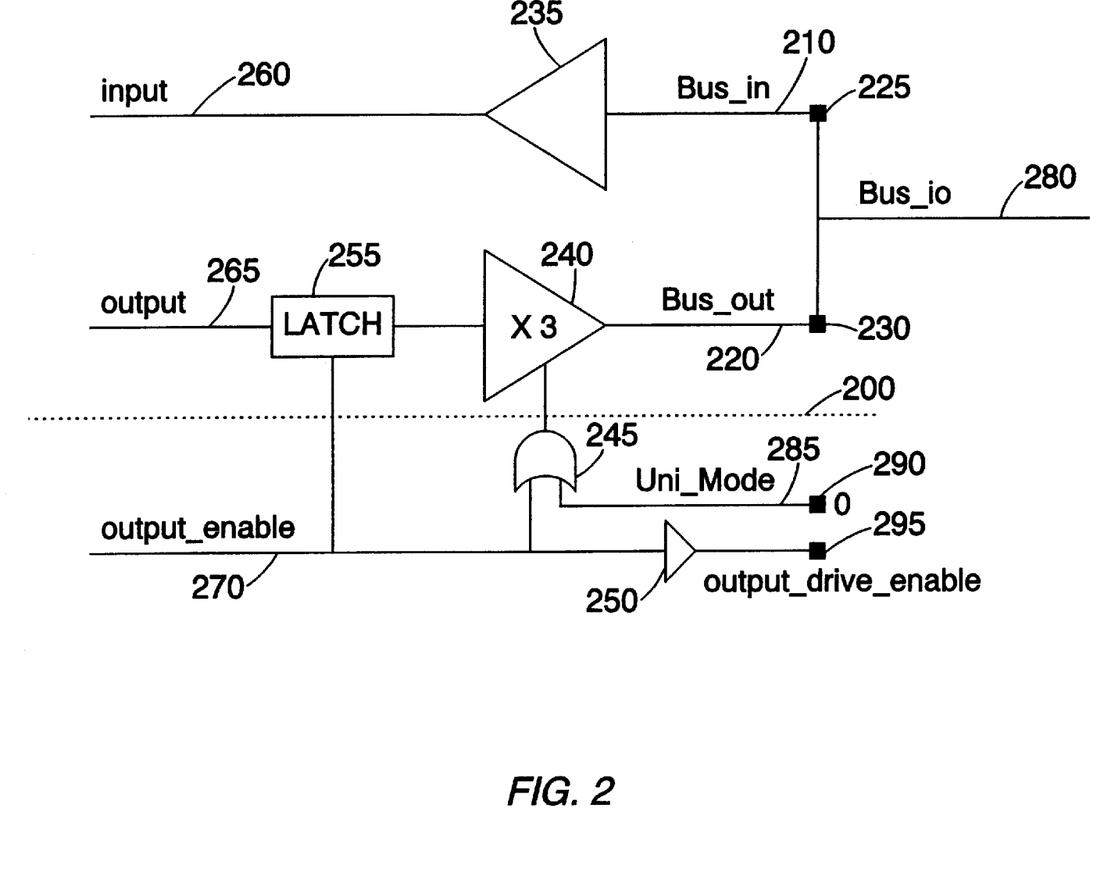
FIG. 2 is an illustration of a macrocell interface in accordance with preferred embodiments of the present invention, when configured to interface with a bidirectional bus.

As mentioned earlier, a bus will typically be a multi-bit bus, with separate bus lines being provided for each bit. In FIG. 2, the circuitry above the dotted line 200 illustrates the logic provided within the macrocell interface 25 for one bus line, this logic being replicated for each bus line provided by the bus. In contrast, the circuitry below the dotted line 200 would only generally be replicated for each bus (e.g. data bus, address bus, control bus). However, in preferred embodiments, as discussed later, there is only one terminal 290 for the whole macrocell.

The macrocell interface illustrated in FIG. 2 has separate input 210 and output 220 buses connected to input bus terminals 225 and 230, respectively. Data received at the input terminal 225 is passed over the input bus 210 to a buffer 235 which then passes that data over the path 260 to the processor core of the CPU 20. If the macrocell interface is incorporated in macrocells other than the CPU, then of course the macrocell logic receiving the data over path 260 will not be the processor core of the CPU, but will instead be the macrocell logic provided by that specific macrocell.

The buffer 235 may be any appropriate buffer, and in preferred embodiments the buffer 235 is arranged to always output over the path 260 the data input on the input bus 210, which may then be latched internally if desired. However, it will be appreciated by those skilled in the art that, alternatively, the buffer 235 could be arranged to only output data on the path 260 when the particular macrocell is awaiting input data. The buffer 235 ensures that the macrocell provides at its input a predetermined load to the chip.

When the macrocell logic, in preferred embodiments the processor core of the CPU 20, outputs data to be passed onto a bus of the data processing circuit 10, then the macrocell logic outputs that data on the path 265 to the latch 255, and from there to the buffer 240. In preferred embodiments, the latch 255 is arranged to receive an output_enable signal over path 270, this output_enable signal being arranged to have a logic "0" value when the macrocell logic is not outputting data, and to have a logic "1" value when the macrocell logic is outputting data. Hence, in preferred embodiments, the latch 255 is driven when the macrocell logic is outputting data, and accordingly the data output on path 265 is passed directly to the input of the buffer 240.

In preferred embodiments, the buffer 240 is a tristate buffer, a tristate buffer being arranged to have a high impedance when not driven, and to output either a logic "0" or a logic "1" value when driven. Hence, when the tristate buffer 240 is driven, then it will pass the data output by the macrocell logic over the output bus 220 to the output bus terminal 230. The buffer 240 is arranged in preferred embodiments to convert the relatively weak internal signal into a stronger signal for outputting to the bus.

The output of an OR gate 245 is used to drive the tristate buffer 240 in preferred embodiments, the OR gate 245 receiving as its inputs the output_enable signal over path 270, and a uni_mode signal over path 285. Hence, in preferred embodiments, if the output enable signal is at a logic "1" value, thereby indicating that the macrocell logic is outputting data, then the OR gate 245 will output a logic "1" value to the tristate buffer 240 in order to turn the tristate buffer 240 on. Alternatively, or in addition, if the uni_mode signal is at a logic "1" value, then the OR gate 245 will also output a logic "1" value to the tristate buffer 240 to turn that buffer on.

In preferred embodiments, a buffer 250 is also provided to buffer the line 270 carrying the output_enable signal from any circuitry attached to an output_drive_enable terminal 295 provided on the macrocell. This buffer 250 ensures that, independent of the external load attached to the output_drive_enable terminal 295, the timing of the signal on the internal output_enable signal line 270 will not be affected, and hence the operation of the macrocell interface logic is not affected by the loading external to the macrocell.

In the embodiment illustrated in FIG. 2, the macrocell interface logic is arranged to be connected to a bidirectional bus 280 provided on the data processing circuit 10. In such a configuration, the input bus 210 and the output bus 220 are linked together via an external connection between the input bus terminal 225 and the output bus terminal 230. Further, the terminal 290 arranged to receive the uni_mode signal is arranged to be connected to a logic "0" level signal. It will be apparent that there are many different ways in which this signal can be provided to the terminal 290. For example, the terminal 290 could be hard wired to the supply or ground power rail.

Once the external connections described above have been made, then the macrocell interface will ensure that the macrocell operates correctly when connected to the bidirectional bus 280. In this embodiment, since the signal received at the terminal 290 is at a logic "0" level, then the tristate buffer 240 will only be turned on when the output_enable signal is also high, thereby indicating that that particular macrocell is to output data onto the bidirectional bus 280. When not turned on, the tristate buffer 240 will have a high impedance, and will therefore output nothing onto the bidirectional bus 280.

In preferred embodiments, all of the various macrocells on the data processing circuit 10 will be arranged to operate from an output_enable signal, and only one macrocell will issue a logic "1" level output_enable signal at any particular time, thereby guaranteeing that there is never any contention for the bidirectional bus 280 between different macrocells. As discussed earlier, contention free bus driving is managed by the bus protocol, as implemented by logic such as the arbiter 80 and decoder 45 illustrated in FIG. 1, and logic within the macrocell.

In preferred embodiments, as mentioned earlier, the buffer 235 connected to the input bus 210 will typically always be driven, and hence any data on the bidirectional bus 280 will be passed via the input bus 210 over the path 260 to the macrocell logic. However, in preferred embodiments, the macrocell logic will only use this data when it is expecting input data from the bidirectional bus 280 according to the bus protocol.

Figure 3:
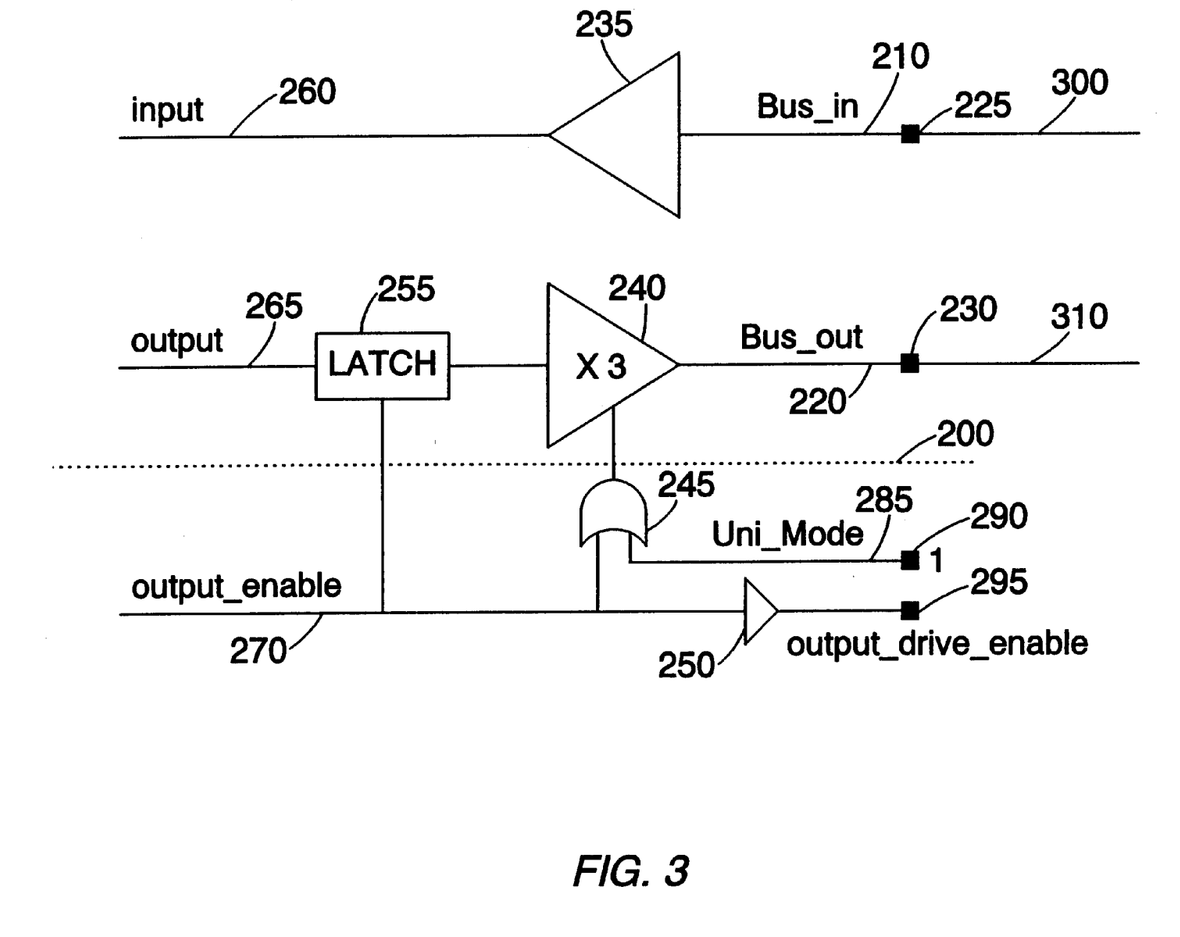
FIG. 3 illustrates a macrocell interface of preferred embodiments of the present invention, when configured to interface with a unidirectional bus.

Having described how the macrocell interface of preferred embodiments may operate in a bidirectional bus configuration mode, FIG. 3 provides an illustration of how the same macrocell interface may operate in a unidirectional bus configuration mode without any alterations being necessary to the macrocell itself.

In this embodiment, the data processing circuit 10 provides separate input buses 300 and output buses 310. The input bus 210 within the macrocell interface is then connected to the input bus 300 of the data processing circuit 10 via the input bus terminal 225, and similarly the output bus 220 within the macrocell interface is connected to the output bus 310 of the data processing circuit 10 via the output terminal 230.

In addition, path 285 is hard wired to a logic "1" level signal via the terminal 290. Once these external connections have been made, the macrocell will operate correctly with the unidirectional bus. Since path 285 is connected to a logic "1" level signal, then the OR gate 245 will permanently drive the tristate buffer 240, so that the tristate buffer can never be in the high impedance state. In effect, the tristate buffer 240 is forced to act as a standard buffer and will always output either a logic "0" or a logic "1" signal on the output bus 220. As discussed earlier, in typical unidirectional bus configurations, multiplexer circuitry is provided to switch the output from any particular macrocell onto the output bus 310.

Given that the buffer 240 is always driven, then, without the latch 255, the output from the macrocell logic over path 265 would permanently be output by the buffer 240 onto the output bus 220. This is undesirable, since any minor fluctuations in the signal on the path 265 may cause the buffer 240 to change state from the logic "0" level to the logic "1" level, or vice versa, and each time the state of the output signal changes, the buffer consumes power. Hence, in preferred embodiments, a latch 255 is provided between the output of the macrocell logic and the buffer 240, the latch being arranged to be driven by the output_enable signal. Hence, when the macrocell logic is not outputting date, the latch 255 will be switched off, and hence will isolate the buffer 240 from the output path 265. Thus, the signal on the output bus 220 will remain constant. However, when the macrocell logic is outputting data, the output_enable signal will go high, and the latch 255 will be turned on, thereby allowing the data on the output path 265 to pass to the buffer 240. The data on the output bus 220 will then reflect the data on the input path 265, and this data will then be output onto the output bus 310 of the data processing circuit 10.

From the above description of FIGS. 2 and 3, it can be seen that the macrocell interface of preferred embodiments of the present invention enables the macrocell to be connected to either a bidirectional bus or a unidirectional bus without any internal changes being required to the macrocell. All that is required is for some simple connections to be made to the appropriate terminals of the macrocell to configure the macrocell for either a bidirectional bus or a unidirectional bus.

In addition, the configuration described with reference to FIGS. 2 and 3 also provides further flexibility. For example, if a user requires a stronger driver for data output onto a bidirectional bus, then the external connections illustrated in FIG. 4 can be made. The input bus terminal 225 and output bus terminal 230 are not connected together and hence, as far as the macrocell is concerned, the macrocell is configured to operate with a unidirectional bus. Hence, as with the FIG. 3 example, terminal 290 is connected to a logic "1" level signal so that the tristate buffer 240 is permanently driven.

Figure 4:
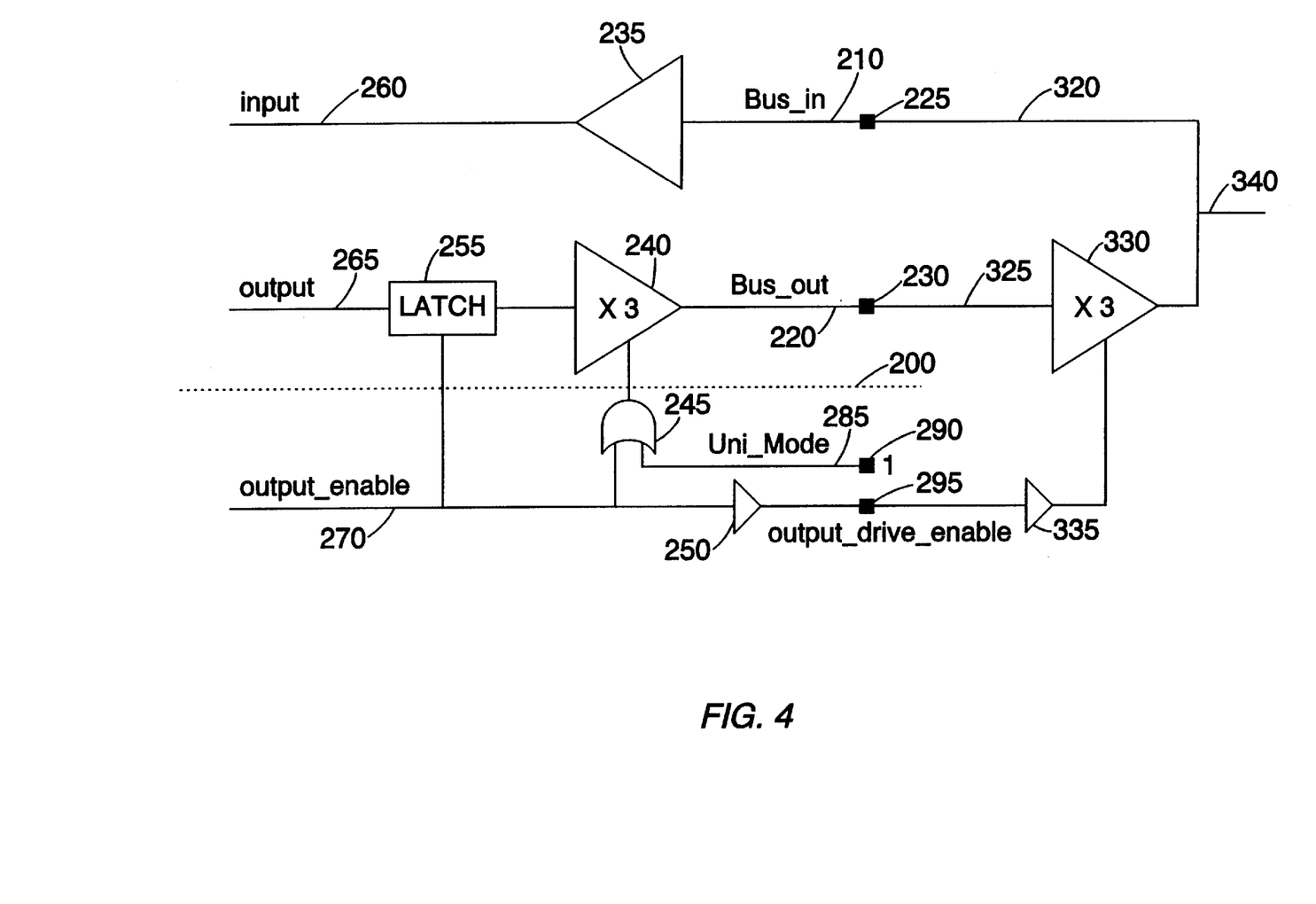
FIG. 4 illustrates a macrocell interface of preferred embodiments, when configured to operate with a bidirectional bus, but with some additional buffering provided externally to the macrocell.

The input bus terminal 225 is then connected to the bidirectional bus 340 via path 320 and the output bus terminal 230 is connected to the bidirectional bus 340 via the path 325 and a tristate buffer 330. By providing a logic "1" level signal to the terminal 290 to permanently drive the tristate buffer 240, this prevents the output bus 220 from floating (which could lead to the generation of high currents) when the macrocell is not outputting data.

The tristate buffer 330 is driven via the output_enable signal 270 as output from the macrocell at the terminal 295 and passed via a buffer 335 to the tristate buffer 330. Hence, the tristate buffer 330 is only driven when the output_enable signal is high, thus ensuring that the macrocell operates correctly with the bidirectional bus 340. For data output from the macrocell, additional amplification is provided via the tristate buffer 330 in order to provide a stronger output signal.

It should be noted that, irrespective of the configuration chosen, the timing and drive strength are kept identical for the macrocell. The uni_mode signal provided over path 285 is only strapped in static configuration, and no timing parameters are characterised from this input.

In a typical chip, a number of separate buses may be provided. For example, the chip may include a 32-bit Data bus, plus a data_drive_enable line, a 32-bit Address and an n-bit Control bus (where n is, for example, 6 or 8), plus a master_drive_enable line, and a 3-bit Slave response bus, plus a response_drive_enable line. The Slave response bus is used by Bus Slaves to provide status information such as busy, error, or success indications. Additionally, in preferred embodiments, the Request/Grant interface to the Arbiter is always driven, and a decoder is employed to ensure that only one Bus Slave is active at any one time.

Further, in preferred embodiments, a single uni_mode signal is provided to configure a particular macrocell, since the macrocell of preferred embodiments has all of its input and output bus lines connected to buses that are either unidirectional or bidirectional.

Although a particular embodiment has been described herein it will be appreciated that the invention is not limited thereto and that many modifications and additions thereto may be made within the scope of the invention. For example, various combinations of the features of the following dependent claims could be made with the features of the independent claims without departing from the scope of the present invention.

I claim:

1. A macrocell for a data processing circuit, comprising:
   macrocell logic; and
   a single interface for connecting the macrocell logic to a bus of the data processing circuit where the bus may be either one of a unidirectional bus or a bidirectional bus, the interface comprising:
      an input bus connected to an input bus terminal and an output bus connected to an output bus terminal;
      a buffering circuit for buffering the output bus from the macrocell logic; and
      a mode input terminal for receiving a mode value, the mode value being arranged to control the buffering circuit; wherein the buffering circuit is responsive to a first mode value to enter an inactive state when no data is being output from the macrocell, and is responsive to a second mode value to permanently drive the output bus
   wherein said unidirectional bus connection is arranged such that the output bus terminal is coupled to a first unidirectional bus on the data processing circuit and the input bus terminal is coupled to a second unidirectional bus on the data processing circuit, said unidirectional bus connection is enabled in response to the second mode value being supplied to the mode input terminal; and
   wherein said bidirectional bus connection is arranged such that the input bus terminal and output bus terminal are connected together externally to the macrocell to enable the macrocell to be coupled to a bidirectional bus on the data processing circuit, and the bidirectional bus connection is enabled in response to the first mode value being supplied to the mode input terminal and the buffering circuit is responsive to an output enable signal to enter an active state when data is output from the macrocell.

2. A macrocell as claimed in claim 1, wherein the buffering circuit comprises a tristate buffer.

3. A macrocell as claimed in claim 2, wherein the tristate buffer is turned on in response to receipt of the second mode value by the macrocell, or in response to the output enable signal generated by the macrocell.

4. A data processing circuit, comprising:
   a plurality of macrocells;
   a bus connecting the macrocells;
   at least one of the macrocells being a macrocell of claim 1.

5. A macrocell as claimed in claim 1, wherein said inactive state is a high impedance state.

6. A macrocell as claimed in claim 3, wherein the interface further comprises a logical OR gate which is arranged to receive at its inputs the mode value and the output enable signal, the output of the logical OR gate being used to control the tristate buffer.

7. A macrocell as claimed in claim 6, wherein the second mode value is a logic '1' level signal which, when the macrocell is arranged to be coupled to the first and second unidirectional buses on the data processing circuit, causes the tristate buffer to be turned on so as to permanently drive the output bus.

8. A macrocell as claimed in claim 1, wherein the macrocell logic is a processor core.

9. A macrocell for a data processing circuit, comprising:
   macrocell logic; and
   an interface for connecting the macrocell logic to a bus of the data processing circuit;
   the interface comprising:
      an input bus connected to an input bus terminal and an output bus connected to an output bus terminal;
      a buffering circuit for buffering the output bus from the macrocell logic;
      a mode input terminal for receiving a mode value, the mode value being arranged to control the buffering circuit;
   the buffering circuit being responsive to a first mode value to enter an inactive state when no data is being output from the macrocell, and being responsive to a second mode value to permanently drive the output bus;
   whereby to enable the macrocell to be coupled to a unidirectional bus on the data processing circuit, the second mode value is supplied to the mode input terminal, whilst to enable the macrocell to be coupled to a bidirectional bus on the data processing circuit, the input bus terminal and output bus terminal are connected together externally to the macrocell, and the first mode value is supplied to the mode input terminal;
   wherein the buffering circuit comprises a tristate buffer and the tristate buffer is turned on in response to receipt of the second mode value by the macrocell, or in response to the output enable signal generated by the macrocell, wherein the interface further comprises a logical OR gate which is arranged to receive at its inputs the mode value and the output enable signal, the output of the logical OR gate being used to control the tristate buffer, wherein the first mode value is a logic '0' level signal which, when the macrocell is arranged to be coupled to the bidirectional bus on the data processing circuit, causes the tristate buffer to be turned on only when the output enable signal is at a logic '1' level, thereby causing the tristate buffer to enter a high impedance state when no data is being output from the macrocell.

10. A macrocell for a data processing circuit, comprising:

macrocell logic; and an interface for connecting the macrocell logic to a bus of the data processing circuit;

the interface comprising:

an input bus connected to an input bus terminal and an output bus connected to an output bus terminal;

a buffering circuit for buffering the output bus from the macrocell logic;

a mode input terminal for receiving a mode value, the mode value being arranged to control the buffering circuit;

the buffering circuit being responsive to a first mode value to enter an inactive state when no data is being output from the macrocell, and being responsive to a second mode value to permanently drive the output bus;

whereby to enable the macrocell to be coupled to a unidirectional bus on the data processing circuit, the second mode value is supplied to the mode input terminal, whilst to enable the macrocell to be coupled to a bidirectional bus on the data processing circuit, the input bus terminal and output bus terminal are connected together externally to the macrocell, and the first mode value is supplied to the mode input terminal;

wherein the buffering circuit comprises a tristate buffer and the tristate buffer is turned on in response to receipt of the second mode value by the macrocell, or in response to the output enable signal generated by the macrocell, wherein the buffering circuit further comprises a latch located between the output of the macrocell logic and the tristate buffer, the latch being arranged to be driven by the output enable signal.

11. A macrocell for a data processing circuit, comprising:

macrocell logic; and an interface for connecting the macrocell logic to a bus of the data processing circuit;

the interface comprising:

an input bus connected to an input bus terminal and an output bus connected to an output bus terminal;

a buffering circuit for buffering the output bus from the macrocell logic;

a mode input terminal for receiving a mode value, the mode value being arranged to control the buffering circuit;

the buffering circuit being responsive to a first mode value to enter an inactive state when no data is being output from the macrocell, and being responsive to a second mode value to permanently drive the output bus;

whereby to enable the macrocell to be coupled to a unidirectional bus on the data processing circuit, the second mode value is supplied to the mode input terminal, whilst to enable the macrocell to be coupled to a bidirectional bus on the data processing circuit, the input bus terminal and output bus terminal are connected together externally to the macrocell, and the first mode value is supplied to the mode input terminal;

wherein the buffering circuit comprises a tristate buffer and the tristate buffer is turned on in response to receipt of the second mode value by the macrocell, or in response to the output enable signal generated by the macrocell, wherein the interface comprises an output enable terminal for outputting the output enable signal and a buffer for buffering the output enable signal prior to it being passed to the output enable terminal.

* * * * *